(12) United States Patent
Cheng et al.

(10) Patent No.: US 11,713,242 B2
(45) Date of Patent: *Aug. 1, 2023

(54) MEMS DEVICE WITH DUMMY-AREA UTILIZATION FOR PRESSURE ENHANCEMENT

(71) Applicant: Taiwan Semiconductor Manufacturing Company, Ltd., Hsin-Chu (TW)

(72) Inventors: Chun-Wen Cheng, Zhubei (TW); Fei-Lung Lai, New Taipei (TW); Kuei-Sung Chang, Kaohsiung (TW); Shang-Ying Tsai, Pingzhen (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/524,155

(22) Filed: Nov. 11, 2021

(65) Prior Publication Data

US 2022/0063994 A1 Mar. 3, 2022

Related U.S. Application Data

(63) Continuation of application No. 16/525,938, filed on Jul. 30, 2019, now Pat. No. 11,174,158.

(Continued)

(51) Int. Cl.
  *G01L 19/06* (2006.01)
  *G01L 9/00* (2006.01)
  *B81C 1/00* (2006.01)

(52) U.S. Cl.
  CPC ........ *B81C 1/00325* (2013.01); *G01L 9/0045* (2013.01); *G01L 9/0073* (2013.01); *G01L 19/0627* (2013.01)

(58) Field of Classification Search
  CPC ..... G01L 19/147; G01L 9/0042; G01L 19/04; G01L 9/0054; G01L 9/0072;
  (Continued)

(56) References Cited

U.S. PATENT DOCUMENTS 5,331,191 A 7/1994 Sugiura et al.
9,695,039 B1 * 7/2017 Liu ........................ B81B 3/0051
(Continued)

FOREIGN PATENT DOCUMENTS

CN 104303262 A 1/2015
CN 105307974 A 2/2016
(Continued)

OTHER PUBLICATIONS

Ex-Parte Quayle Office Action dated May 4, 2021 for U.S. Appl. No. 16/525,938.

(Continued)

*Primary Examiner* — Andre J Allen
(74) *Attorney, Agent, or Firm* — Eschweiler & Potashnik, LLC

(57) ABSTRACT

In some embodiments, a sensor is provided. The sensor includes a microelectromechanical systems (MEMS) substrate disposed over an integrated chip (IC), where the IC defines a lower portion of a first cavity and a lower portion of a second cavity, and where the first cavity has a first operating pressure different than an operating pressure of the second cavity. A cap substrate is disposed over the MEMS substrate, where a first pair of sidewalls of the cap substrate partially define an upper portion of the first cavity, and a second pair of sidewalls of the cap substrate partially define an upper portion of the second cavity. A sensor area comprising a movable portion of the MEMS substrate and a dummy area comprising a fixed portion of the MEMS (Continued)

substrate are both disposed in the first cavity. A pressure enhancement structure is disposed in the dummy area.

20 Claims, 13 Drawing Sheets

Related U.S. Application Data

(60) Provisional application No. 62/752,660, filed on Oct. 30, 2018.

(58) Field of Classification Search
CPC ... G01L 13/025; G01L 19/14; G01L 19/0038; G01L 19/0084; G01L 9/0055; G01L 9/0075; G01L 19/0069; G01L 9/0052; G01L 9/0073; G01L 19/0092; G01L 19/0618; G01L 19/0645; G01L 19/143; G01L 9/0051; G01L 9/0007; G01L 19/0046; G01L 19/06; G01L 19/0627; G01L 19/0681; G01L 27/002; G01L 9/00; G01L 9/0041; G01L 9/0044; G01L 11/025; G01L 11/04; G01L 19/0023; G01L 19/0672; G01L 19/069; G01L 19/142; G01L 19/145; G01L 19/16; G01L 7/00; G01L 9/0047; G01L 9/06; G01L 9/065; G01L 9/12; G01L 11/02; G01L 13/00; G01L 15/00; G01L 19/0015; G01L 19/003; G01L 19/02; G01L 19/0609; G01L 19/083; G01L 19/10; G01L 19/148; G01L 27/005; G01L 7/08; G01L 7/082; G01L 7/163; G01L 7/166; G01L 9/0045; G01L 9/0048; G01L 9/006; G01L 9/007; G01L 9/0076; G01L 9/04; G01L 9/045; G01L 9/125; G01L 11/00; G01L 17/00; G01L 19/00; G01L 19/0076; G01L 19/08; G01L 19/141; G01L 19/146; G01L 1/142; G01L 1/2262; G01L 1/246; G01L 21/12; G01L 23/16; G01L 27/007; G01L 7/04; G01L 7/063; G01L 7/084; G01L 7/086; G01L 7/16; G01L 9/0002; G01L 9/0007; G01L 9/0016; G01L 9/0019; G01L 9/0022; G01L 9/0027; G01L 9/0033; G01L 9/0039; G01L 9/005; G01L 9/0058; G01L 9/0077; G01L 9/0079; G01L 9/008; G01L 9/0092; G01L 9/0095; G01L 9/025; G01L 9/08; G01L 9/085; G01L 9/105; G01L 9/14; G01L 9/16; H01L 2224/48091

See application file for complete search history.

(56) References Cited

U.S. PATENT DOCUMENTS

| | | |
|---|---|---|
| 9,857,229 B1 | 1/2018 | Steffanson |
| 10,221,065 B2 | 3/2019 | Lee et al. |
| 10,392,244 B2 | 8/2019 | Hung et al. |
| 2005/0179099 A1 | 8/2005 | Lutz et al. |
| 2013/0001710 A1 | 1/2013 | Daneman et al. |
| 2014/0225206 A1 | 8/2014 | Lin et al. |
| 2015/0097253 A1 | 4/2015 | Tsau et al. |
| 2015/0210541 A1 | 7/2015 | Kang et al. |
| 2015/0284240 A1 | 10/2015 | Chu et al. |
| 2015/0291416 A1 | 10/2015 | Liang et al. |
| 2016/0107882 A1 | 4/2016 | Cuzzocrea et al. |
| 2017/0107100 A1 | 4/2017 | Cheng et al. |
| 2017/0297909 A1 | 10/2017 | Shin et al. |
| 2021/0060610 A1 | 3/2021 | Chiu et al. |

FOREIGN PATENT DOCUMENTS

| | | |
|---|---|---|
| CN | 105480935 A | 4/2016 |
| CN | 106976838 A | 7/2017 |
| CN | 107010594 A | 8/2017 |
| TW | 201813916 A | 4/2018 |

OTHER PUBLICATIONS

Notice of Allowance dated Jul. 21, 2021 for U.S. Appl. No. 16/525,938.

\* cited by examiner

MEMS DEVICE WITH DUMMY-AREA UTILIZATION FOR PRESSURE ENHANCEMENT

REFERENCE TO RELATED APPLICATIONS

This application is a Continuation of U.S. application Ser. No. 16/525,938, filed on Jul. 30, 2019, which claims the benefit of U.S. Provisional Application No. 62/752,660, filed on Oct. 30, 2018. The contents of the above referenced Patent applications are hereby incorporated by reference in their entirety.

BACKGROUND

Microelectromechanical systems (MEMS) devices are microscopic devices that integrate mechanical and electrical components to sense physical quantities and/or to act upon surrounding environments. In recent years, MEMS devices have become increasingly common. For example, MEMS accelerometers and motion sensors are commonly found in airbag deployment systems, tablet computers, and smart phones.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
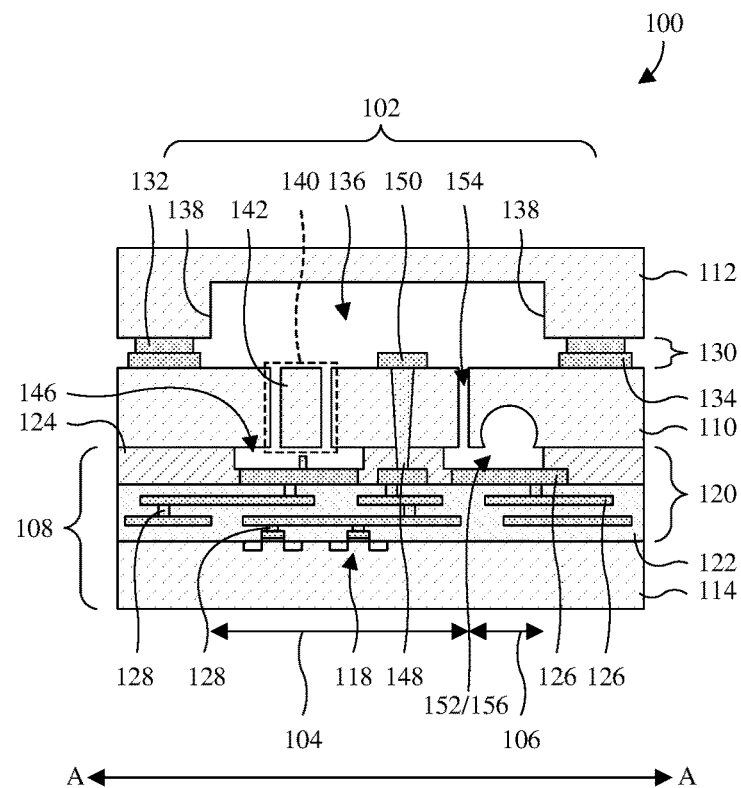
FIGS. 1A-1B illustrate various views of some embodiments of a sensor having dummy-area utilization for pressure enhancement.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, an integrated chip (IC) comprises a first microelectromechanical systems (MEMS) device and a second MEMS device, and the first and second MEMS devices are dependent on different pressures. For example, the first MEMS device may be a 3 axis accelerometer that depends on a first pressure, and the second MEMS device may be a 3 axis gyroscope that depends on a second pressure different than the first pressure. Typically, a method for forming the IC comprises sealing cavities of the first and second MEMS devices at a first pressure, opening the cavity of the second MEMS device, and resealing the cavity of the second MEMS device at a second pressure. However, opening and resealing the cavity increases the difficulty of the method, and thus increases the cost to manufacture the IC.

In some embodiments, the first MEMS device has a dummy area. The dummy area may, for example, be a fixed area of the first MEMS device with no electrical routing. Further, in some embodiments, the dummy area arises due to integration of the first MEMS device with the second MEMS device in the IC. For example, disparate minimum dimensions of the first and second MEMS devices may lead to the first MEMS device being larger than it would otherwise be, and thus may lead to the dummy area.

Various embodiments of the present application are directed toward a sensor having one or more MEMS devices with dummy-area utilization for pressure enhancement. For example, the sensor may comprise a first MEMS device that depends on a cavity of the first MEMS device having a first operating pressure, and a second MEMS device that depends on a cavity of the second MEMS device having a second operating pressure different than the first operating pressure. A pressure enhancement structure is disposed in a dummy area of the first MEMS device. The pressure enhancement structure is configured to change a pressure of the cavity of the first MEMS device to the first operating pressure from a pressure at which the cavity of the first MEMS device and the second MEMS device are sealed. Because the pressure enhancement structure changes the pressure of the cavity of the first MEMS device, the first and second MEMS may be formed with different operating pressures (e.g., the first and second operating pressures, respectively) and without having to open and/or reseal the first or second MEMS devices. Accordingly, a cost to manufacture the sensor may be reduced.

Figure 1B:
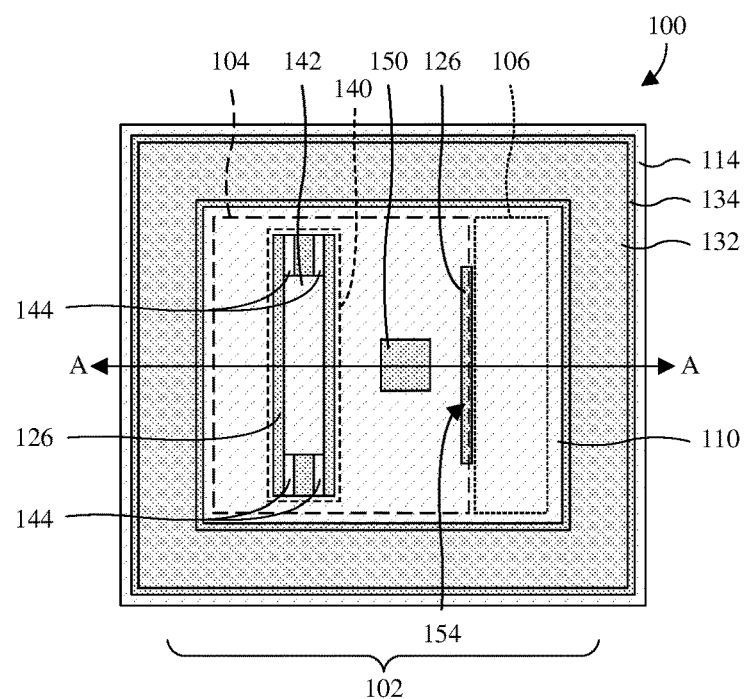

FIGS. 1A-1B illustrate various views of some embodiments of a sensor 100 having dummy-area utilization for pressure enhancement. FIG. 1A illustrates a cross-sectional view of some embodiments of the sensor of FIG. 1B taken along line A-A. FIG. 1B illustrates a top view of the sensor of FIG. 1A with the cap substrate 112 removed.

As shown in FIGS. 1A-1B, the sensor 100 comprises a microelectromechanical systems (MEMS) device 102. The MEMS device 102 may, for example, be an accelerometer, a gyroscope, or some other MEMS device. In some embodiments, the MEMS device 102 comprises a sensor area 104 and a dummy area 106.

In some embodiments, the MEMS device 102 is defined by an integrated chip (IC) 108, a MEMS substrate 110, and a cap substrate 112. The IC 108 comprises a chip substrate 114, an interconnect structure 120, and a plurality of semiconductor devices 118. In some embodiments, the chip substrate 114 comprises any type of semiconductor body (e.g., monocrystalline silicon/CMOS bulk, silicon-germanium (SiGe), silicon on insulator (SOI), etc.). The semiconductor devices 118 may be or comprise, for example, metal-oxide-semiconductor (MOS) field-effect transistors (FETs), some other MOS devices, or some other semiconductor devices.

The interconnect structure 120 comprises an interconnect dielectric structure 122 and a passivation layer 124. In some embodiments, the interconnect dielectric structure 122 comprises one or more dielectric layers (e.g., one or more interlayer dielectric layers). Further, the interconnect structure 120 comprises a plurality of conductive lines 126 (e.g., metal lines, metal pads, etc.) and a plurality of conductive vias 128 (e.g., metal vias, metal contacts, etc.). The passivation layer 124 overlies the interconnect dielectric structure 122, the conductive lines 126, and the conductive vias 128. The conductive lines 126 and the conductive vias 128 are alternatingly stacked in the interconnect dielectric structure 122 and the passivation layer 124.

In some embodiments, the passivation layer 124 may comprise, for example, an oxide (e.g., silicon dioxide ($SiO_2$)), a nitride (e.g., silicon nitride (e.g., SiN)), an oxynitride (e.g., silicon oxy-nitride ($SiO_xN_y$)), some other dielectric material, or a combination of the foregoing. In further embodiments, the conductive lines 126 and the conductive vias 128 comprise, for example, copper, aluminum copper, tungsten, aluminum, some other conductive material, or a combination of the foregoing. In further embodiments, the interconnect dielectric structure 122 comprises one or more of, for example, a low-k dielectric layer (e.g., a dielectric with a dielectric constant less than about 3.9), an ultra-low-k dielectric layer, an oxide (e.g., $SiO_2$), some other dielectric material, or a combination of the foregoing The MEMS substrate 110 overlies and is bonded to the IC 108. In some embodiments, the MEMS substrate 110 comprises any type of semiconductor body (e.g., monocrystalline silicon/CMOS bulk, silicon-germanium (SiGe), silicon on insulator (SOI), etc.). Further, the cap substrate 112 overlies the MEMS substrate 110 and is bonded to the MEMS substrate 110. In some embodiments, the cap substrate 112 comprises any type of semiconductor body (e.g., monocrystalline silicon/CMOS bulk, silicon-germanium (SiGe), silicon on insulator (SOI), etc.).

In some embodiments, the cap substrate 112 is bonded to the MEMS substrate 110 via a bond structure 130 (e.g., a eutectic bond structure). The bond structure 130 may comprise an upper bond ring 132 disposed on a lower bond ring 134. In some embodiments, the lower bond ring 134 may comprise, for example, copper, aluminum, gold, tin, some other bonding material, or a combination of the foregoing. In further embodiments, the upper bond ring 132 may comprise, for example, copper, aluminum, gold, tin, some other bonding material, or a combination of the foregoing. The upper bond ring 132 may have a ring-shaped top layout that continuously extends around both the sensor area 104 and the dummy area 106. In yet further embodiments, the lower bond ring 134 may have a ring-shaped top layout that continuously extends around both the sensor area 104 and the dummy area 106.

In some embodiments, the cap substrate 112, the bond structure 130, the MEMS substrate 110, and the IC 108 define a cavity 136. In further embodiments, the cavity 136 is sealed. In further embodiments, the cavity 136 has an operating pressure that corresponds to a pressure of the MEMS device 102 after the MEMS device 102 has been sealed and come to an equilibrium pressure. In yet further embodiments, the operating pressure may be between about 0.9 millitorr (mTorr) and about 1 standard atmosphere (atm). In further embodiments, a pair of sidewalls 138 of the cap substrate 112 partially define an upper portion of the cavity 136.

The MEMS substrate 110 comprises a movable portion 140. The movable portion 140 of the MEMS substrate 110 is configured to move in relation to the sensor 100 due to an external force exerted on the sensor 100. In some embodiments, the movable portion 140 of the MEMS substrate 110 comprises a movable element 142 (e.g., a proof mass) and one or more tethers 144 that suspend the movable element 142 in the cavity 136, such that the movable element 142 may freely move along an axis (e.g., an x-axis, a y-axis, and/or a z-axis). In further embodiments, the one or more tethers 144 are portions of the MEMS substrate 110. A lower portion 146 of the cavity 136 is disposed directly beneath the movable portion 140 and is partially defined by the IC 108. In yet further embodiments, the lower portion 146 of the cavity 136 is partially defined by the passivation layer 124 and one or more of the conductive lines 126.

In some embodiments, a through-substrate via (TSV) 148 extends through the MEMS substrate 110 to the interconnect structure 120. In further embodiments, the TSV 148 electrically couples a TSV pad 150 to the interconnect structure 120. In further embodiments, the TSV pad 150 is configured to detect movement from the movable element 142, such that the TSV 148 may transmit signals that correspond to a location of the movable element 142 to the interconnect structure 120. In further embodiments, the TSV 148 may comprise, for example, copper, tungsten, aluminum, doped polysilicon, some other conductive material, or a combination of the foregoing. In yet further embodiments, the TSV pad 150 may comprise, for example, copper, aluminum copper, aluminum, gold, some other conductive material, or a combination of the foregoing.

In some embodiments, an embedded chamber 152 is disposed between the MEMS substrate 110 and the IC 108. The embedded chamber 152 is separated from the lower portion 146 of the cavity 136 by the MEMS substrate 110 and the IC 108. In some embodiments, the embedded chamber 152 is one of a plurality of embedded chambers.

The embedded chamber 152 is in fluid communication with the other portions of the cavity 136 (e.g., the lower portion 146 and the upper portion) by a channel 154 that extends through the MEMS substrate 110. In some embodiments, the channel 154 is the only path in which the embedded chamber 152 is in fluid communication with other portions of the cavity 136. In further embodiments, the channel 154 may extend only into the upper portion of the cavity 136, such that the embedded chamber 152 is in fluid communication with the lower portion 146 of the cavity 136 by openings disposed on sides of the movable element 142. In yet further embodiments, the channel 154 has a columnar profile and/or a top layout that is square, triangular, rectangular, circular, or some other geometric shape.

In some embodiments, an upper portion of the embedded chamber 152 is defined by the MEMS substrate 110. The upper portion of the embedded chamber 152 may, for example, have a semicircular profile, a rectangular profile, a square profile, a triangular profile, or some other geometric shape. In further embodiments, a lower portion of the embedded chamber 152 is defined by the IC 108. In further embodiments, the lower portion of the embedded chamber is defined by the passivation layer 124 and/or one or more conductive lines 126. The lower portion of the embedded chamber 152 may have a rectangular profile, a square profile, or some other geometric shape.

In some embodiments, the upper portion of the embedded chamber 152 may have a width between about 1 micrometers (um) and about 2,000 um. More specifically, the width of the upper portion of the embedded chamber 152 may be between about 5 um and about 500 um. The width of the upper portion of the embedded chamber 152 may be less than a width of the lower portion of the embedded chamber 152. In further embodiments, the width of the lower portion of the embedded chamber 152 may be between about 1 um and about 2,000 um.

In further embodiments, a height of the upper portion of the embedded chamber 152 may be between about ten percent of a height of the MEMS substrate 110 (e.g., between an upper surface and a lower surface) and about eighty percent of the height of the MEMS substrate 110. In further embodiments, the height of the upper portion of the embedded chamber 152 may be greater than a height of the lower portion of the embedded chamber 152.

In some embodiments, the embedded chamber 152 is a pressure enhancement structure 156. The pressure enhancement structure 156 is configured to improve control of the operating pressure of the cavity 136. For example, in embodiments in which the pressure enhancement structure 156 is the embedded chamber 152, the embedded chamber 152 is configured to reduce an amount the operating pressure increases after the cavity 136 has been sealed. In such embodiments, the embedded chamber 152 may reduce the amount the operating pressure increases by increasing the volume of the cavity 136, such that, as gases outgas from the sensor 100 after the cavity 136 has been sealed, the outgassing gases will not increase the pressure inside the cavity 136 as much with the embedded chamber 152 as the outgassing gases would increase the pressure inside the cavity 136 without the embedded chamber 152.

The pressure enhancement structure 156 is disposed in the dummy area 106. The dummy area 106 is disposed adjacent the sensor area 104. The sensor area 104 comprise a first portion of the MEMS substrate 110, a first portion of the IC 108, and a first portion of the cap substrate 112. The first portion of the MEMS substrate 110 comprises the movable element 142. In some embodiments, the first portion of the MEMS substrate 110 comprises all of the movable elements of the MEMS substrate 110 (e.g., every movable element 142, every tethers 144, etc.). In further embodiments, the first portion of the MEMS substrate 110 comprise all of the patterned features (e.g., layer, openings, structures, etc.) disposed on/in the MEMS substrate 110, except the pressure enhancement structure 156. The first portion of the IC 108 is an area of the IC 108 disposed directly below the first portion of the MEMS substrate 110, and the first portion of the cap substrate 112 is an area of the cap substrate 112 disposed directly over the first portion of the MEMS substrate 110.

In some embodiments, the sensor area 104 is disposed between the pair of sidewalls 138 of the cap substrate 112. In further embodiments, a perimeter of the sensor area 104 comprises only four sides (e.g., the sensor area may have a single square/rectangular perimeter). It will be appreciated that, in other embodiments, the perimeter of the sensor area 104 may comprise any number of sides and have any shape.

The dummy area 106 comprises a second portion of the MEMS substrate 110, a second portion of the IC 108, and a second portion of the cap substrate 112. In some embodiments, the dummy area 106 comprises a fixed portion of the MEMS substrate 110 (e.g., a portion of the MEMS substrate 110 that does not move in relation to the sensor 100 when an external force is applied to the sensor 100). In some embodiments, the second portion of the MEMS substrate 110 is an area of the MEMS substrate 110 in which the only patterned feature (e.g., layers, cavities, recesses, etc.) disposed in/on the second portion of the MEMS substrate 110 is the pressure enhancement structure 156. The second portion of the IC 108 is an area of the IC 108 disposed directly below the first portion of the MEMS substrate 110, and the first portion of the cap substrate 112 is an area of the cap substrate 112 disposed directly over the first portion of the MEMS substrate 110.

In some embodiments, the dummy area 106 is disposed between the pair of sidewalls 138 of the cap substrate 112. In further embodiments, the dummy area 106 may have a width between about 100 um and about 2,000 um. In yet further embodiments, a portion of a lower surface of the cap substrate 112 disposed in the dummy area 106 may be spaced from an uppermost conductive line 126 disposed directly below the second portion of the MEMS substrate 110 by between about 1 um and about 100 um.

In some embodiments, a perimeter of the dummy area 106 comprises only four sides (e.g., the dummy area may have a single square/rectangular area). It will be appreciated that, in other embodiments, the perimeter of the dummy area 106 may comprise any number of sides and have any shape. In further embodiments, the dummy area 106 arises due to integration of the MEMS device 102 with other features of the sensor 100 (e.g., logic, memory, other MEMS devices, etc.).

Because the pressure enhancement structure 156 is disposed in the dummy area 106, without increasing a size (e.g., a footprint) of the sensor 100, the pressure enhancement structure 156 may improve control over the cavity 136 being at the operating pressure of the MEMS device 102. Accordingly, the sensitivity of the sensor 100 may be improved.

Figure 2:
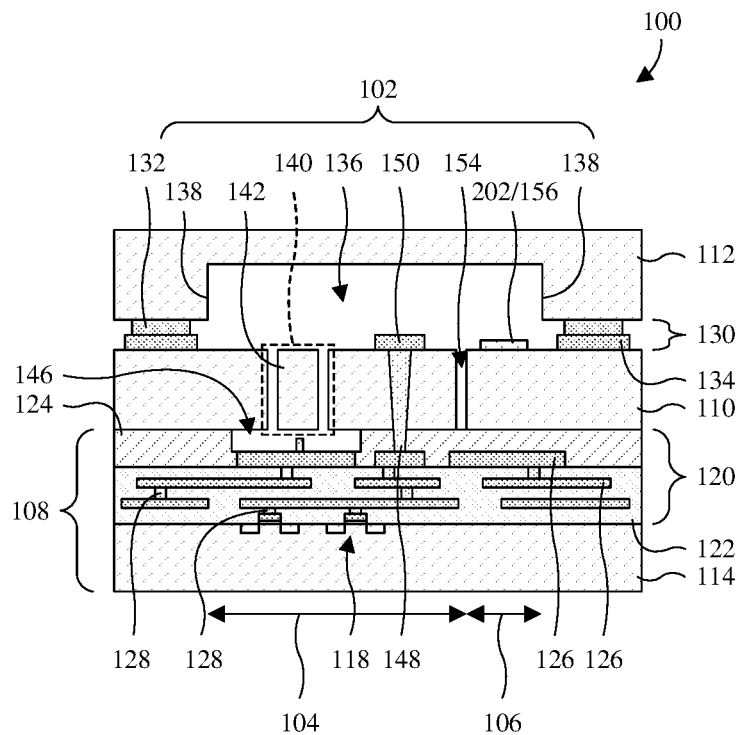
FIG. 2 illustrates a cross-sectional view of some other embodiments of the sensor of FIG. 1A.

FIG. 2 illustrates a cross-sectional view of some other embodiments of the sensor 100 of FIG. 1A.

As shown in FIG. 2, the pressure enhancement structure 156 is a getter structure 202. The getter structure 202 is configured to reduce the pressure inside the cavity 136 after the cavity 136 is sealed, such that the pressure of the cavity 136 may be reduced from a sealing pressure that corresponds to a pressure in which the cavity 136 is sealed. In such embodiments, the getter structure may reduce the pressure inside the cavity 136 after the cavity is sealed by absorbing gases in the cavity 136.

In some embodiments, the getter structure 202 may comprise, for example, titanium, zirconium, titanium zirconium, magnesium, some other getter material, or a combination of the foregoing. In further embodiments, a height of the getter structure 202 may be between about 10 nanometers (nm)

and about 1,000 nm. In yet further embodiments, a width of the getter structure 202 may be between about 1 um and about 2,000 um.

Figure 3:
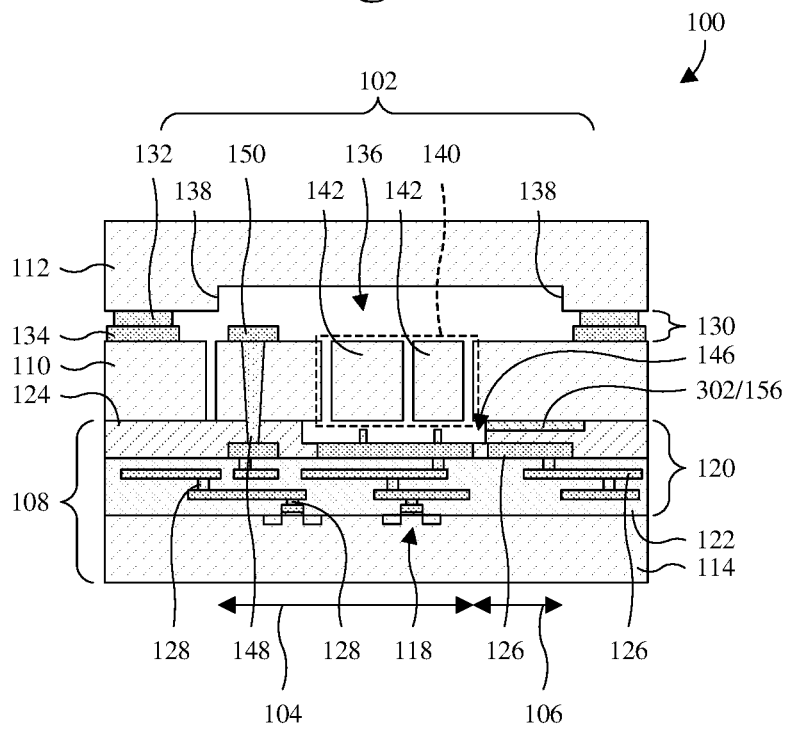
FIG. 3 illustrates a cross-sectional view of some other embodiments of the sensor of FIG. 1A.

FIG. 3 illustrates a cross-sectional view of some other embodiments of the sensor 100 of FIG. 1A.

As shown in FIG. 3, the pressure enhancement structure 156 is an outgassing structure 302. The outgassing structure 302 is configured to increase the pressure inside the cavity 136 after the cavity 136 is sealed, such that the pressure inside the cavity 136 may be increased from the sealing pressure. In such embodiments, the outgassing structure 302 may increase the pressure inside the cavity 136 after the cavity is sealed by outgassing gases from the outgassing structure 302 into the cavity 136.

In some embodiments, the outgassing structure 302 comprises, for example, an oxide (e.g., $SiO_2$), a nitride (e.g. SiN), an oxy-nitride (e.g., $SiO_xN_y$), some other outgassing material, or a combination of the foregoing. In further embodiments, the outgassing structure 302 comprises a different material than the passivation layer 124. In further embodiments, a width of the outgassing structure 302 may be between about 1 um and about 2,000 um. In further embodiments, a height of the outgassing structure 302 is less than a height of the passivation layer 124. In further embodiments, a height of the outgassing structure 302 is less than a height of the lower portion 146 of the cavity 136.

In some embodiments, the MEMS device 102 comprises a plurality of movable elements 142. In such embodiments, each of the movable elements 142 may move along an independent axis (e.g., an x-axis, a y-axis, or a z-axis). In other embodiments, more than one of the movable elements 142 may move in a same axis.

Figure 4:
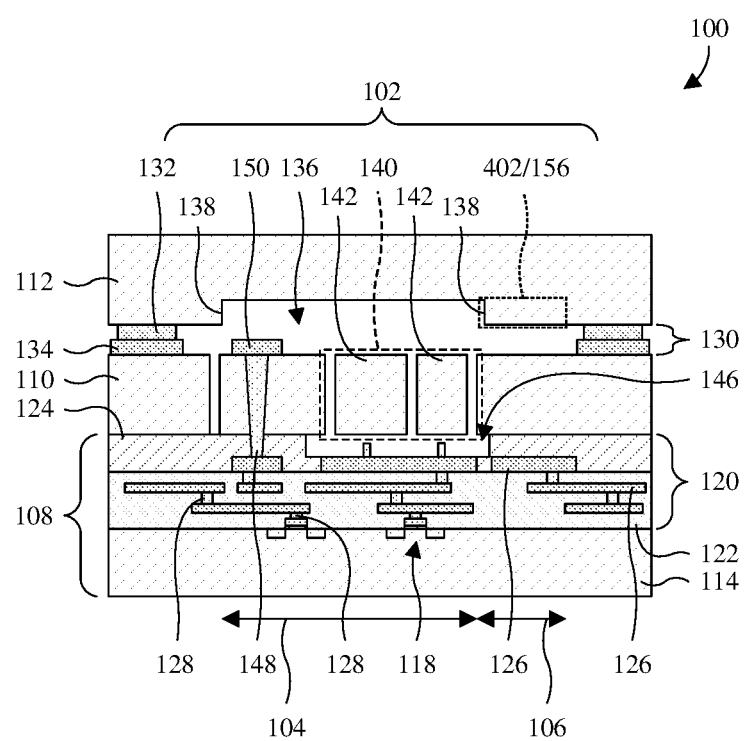
FIG. 4 illustrates a cross-sectional view of some other embodiments of the sensor of FIG. 1A.

FIG. 4 illustrates a cross-sectional view of some other embodiments of the sensor 100 of FIG. 1A.

As shown in FIG. 4, the pressure enhancement structure 156 is a third portion 402 of the cap substrate 112. The third portion 402 of the cap substrate 112 is configured to increase an amount the pressure inside the cavity 136 increases after the cavity 136 has been sealed. In some embodiments, the third portion 402 of the cap substrate 112 may increase the amount the pressure inside the cavity 136 increases after sealing the cavity 136 by decreasing the volume of the cavity 136, such that, as gases outgas from the sensor 100, the outgassing gases increase the pressure in the cavity 136 more with the third portion 402 of the cap substrate 112 than without the third portion 402 of the cap substrate 112.

In some embodiments, the third portion 402 of the cap substrate 112 is partially defined by an area of the cap substrate 112 that extends laterally from one of the sidewalls of the pair of sidewalls 138 through the dummy area 106. In such embodiments, the third portion 402 of the cap substrate 112 is further defined by an area of the cap substrate 112 that extends a distance vertically from a lower surface of the second portion of the cap substrate 112, wherein the distance is a shortest distance from the lower surface of the second portion of the cap substrate 112 to a lower surface of the cap substrate 112 disposed between the pair of sidewalls 138. In some embodiments, a width of the third portion 402 of the cap substrate 112 may be between about 1 um and about 2,000 um.

Figure 5A:
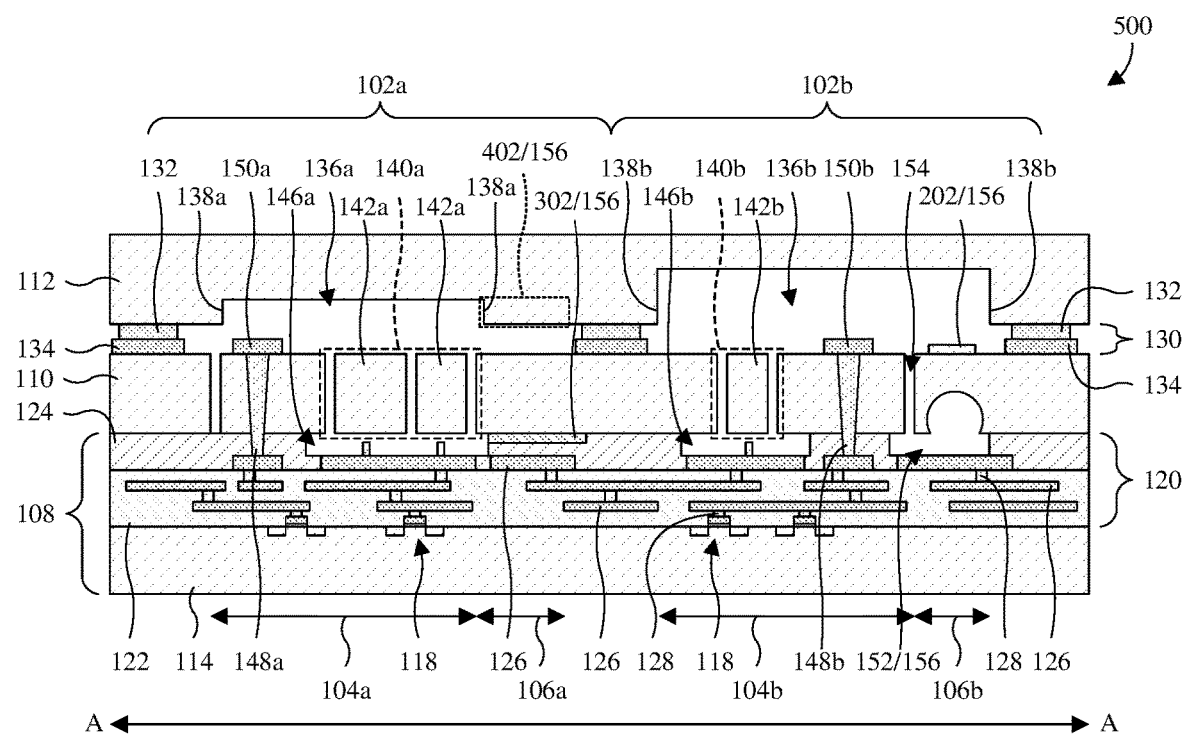
FIGS. 5A-5B illustrate various views of some embodiments of a sensor comprising a plurality of MEMS devices each having dummy-area utilization for pressure enhancement.
Figure 5B:
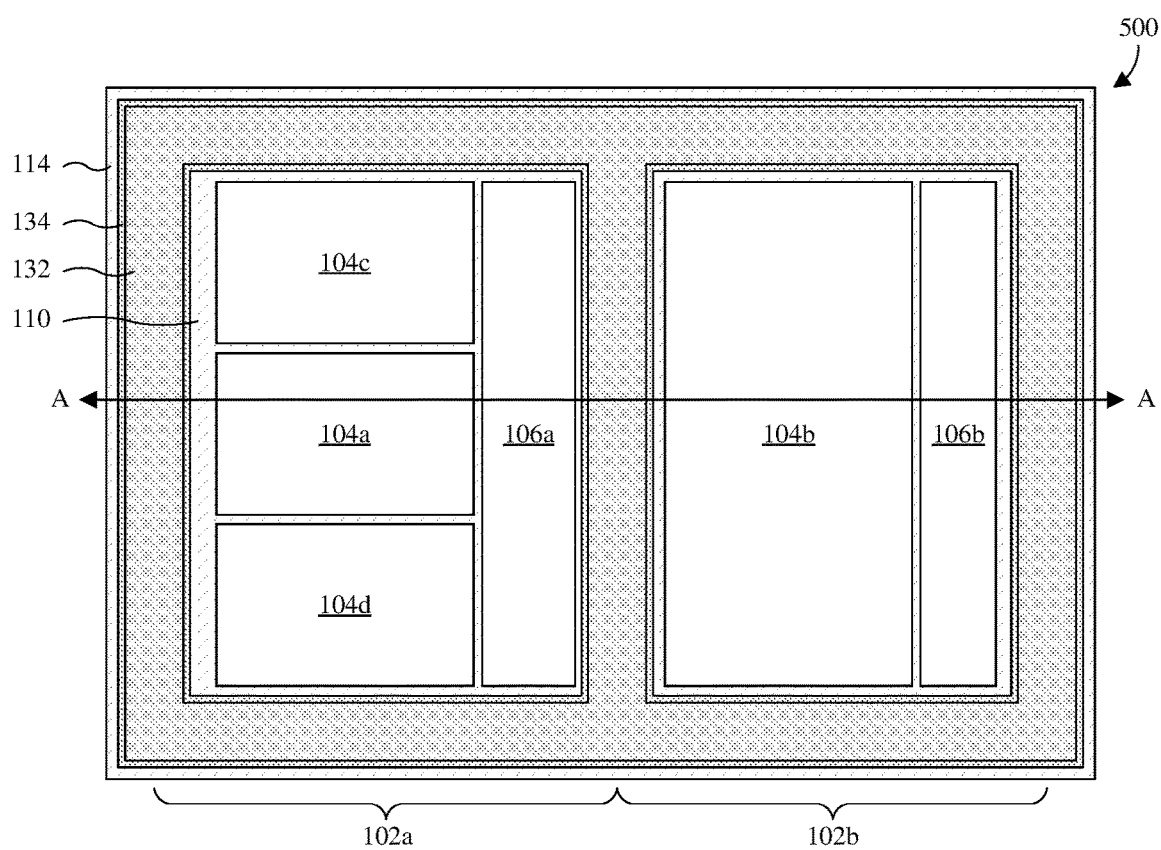

FIGS. 5A-5B illustrate various views of some embodiments of a sensor 500 comprising a plurality of MEMS devices 102a-b each having dummy-area utilization for pressure enhancement. FIG. 5A illustrates a cross-sectional view of some embodiments of the sensor 500 of FIG. 5B taken along line A-A. FIG. 5B illustrates a simplified top view of the sensor 500 of FIG. 5A with the cap substrate 112 removed. FIG. 5B is a "simplified" top view because a plurality of sensor areas 104a-d and a plurality of dummy areas 106a-b are illustrated as a block diagram. Further, some common features in FIG. 5A are labeled with either an "a" or a "b" to illustrate that such common features either correspond to a first MEMS device 102a or a second MEMS device 102b, respectively. For example, a first cavity 136a is labeled with an "a" and corresponds to the first MEMS device 102a, and a second cavity 136b is labeled with a "b" and corresponds to the second MEMS device 102b.

As shown in FIGS. 5A-5B, the sensor 500 comprises a first MEMS device 102a and a second MEMS device 102b. In some embodiments, the first MEMS device 102a and the second MEMS device 102b may be different types of MEMS devices. For example, the first MEMS device may be an accelerometer, and the second MEMS device 102b may be a gyroscope.

In some embodiments, the first MEMS device 102a may comprise a first plurality of sensor areas 104a/104c/104d. For example, the first MEMS device 102a may comprise a first sensor area 104a, a third sensor area 104c, and a fourth sensor area 104d. In further embodiments, the first MEMS device 102a comprises a first dummy area 106a that is disposed adjacent to the first plurality of sensor areas 104a/104c/104d.

In some embodiments, the second MEMS device 102b comprises a second sensor area 104b and a second dummy area 106b. The first MEMS device 102a and the second MEMS device 102b may be disposed on opposite sides of a first portion of the bond structure 130. In further embodiments, the first dummy area 106a is disposed between the first plurality of sensor areas 104a/104c/104d and the first portion of the bond structure 130. In further embodiments, the second sensor area 104b is disposed between the second dummy area 106b and the first portion of the bond structure 130. In yet further embodiments, the first MEMS device 102a and the second MEMS device 102b may have different size constraints (e.g., minimum feature sizes), such that the first MEMS device 102a and/or the second MEMS device 102b are larger than they would otherwise be if the sensor comprised only one of the two MEMS devices. These different size constraints may lead to the first dummy area 106a and/or the second dummy area 106b.

In some embodiments, the first MEMS device 102a is configured to operate at a first operating pressure, and the second MEMS device 102b is configured to operate at a second operating pressure different than the first operating pressure. In some embodiments, the first operating pressure is greater than the second operating pressure. In further embodiments, a ratio between the second operating pressure and the first operating pressure may be greater than or equal to 1:100. In yet further embodiments, the first operating pressure and the second operating pressure may be between about 0.9 mTorr and about 1 atm.

In some embodiments, more than one pressure enhancement structure 156 is disposed in the first dummy area 106a. For example, both the third portion 402 of the cap substrate 112 and the outgassing structure 302 may be disposed in the first dummy area 106a. In such embodiments, the outgassing structure 302 may increase a pressure inside the first cavity 136a after the first cavity 136a is sealed by outgassing gases from the outgassing structure 302 into the first cavity 136a. Further, the third portion 402 of the cap substrate 112 may increase the amount the outgassing gases increase the pressure inside the first cavity 136a by reducing a volume of the first cavity 136a. It will be appreciated that, in other embodiments, either the third portion 402 of the cap substrate 112 or the outgassing structure 302 may be disposed in the first dummy area.

In some embodiments, more than one pressure enhancement structure 156 is disposed in the second dummy area 106b. For example, both the embedded chamber 152 and the getter structure 202 may be disposed in the second dummy area 106b. In such embodiments, the getter structure 202 may reduce the pressure inside the second cavity 136b after the second cavity 136b is sealed by absorbing outgassed gases in the second cavity 136b. Further, the embedded chamber may reduce the amount the outgassed gases increase the pressure inside the second cavity 136b by increasing a volume of the second cavity 136b. It will be appreciated that, in other embodiments, either the embedded chamber 152 or the getter structure 202 may be disposed in the first dummy area.

Because the third portion 402 of the cap substrate 112 and the outgassing structure 302 are disposed in the first dummy area 106a, and because the embedded chamber 152 and the getter structure 202 are disposed in the second dummy area 106b, the first cavity 136a and the second cavity 136b may be sealed at a same sealing pressure, while still having the first cavity 136a operate at the first operating pressure and the second cavity 136b operate at the second operating pressure. Accordingly, a cost to manufacture the sensor 500 may be reduced by reducing the difficulty of manufacturing the sensor 500.

Figure 6:
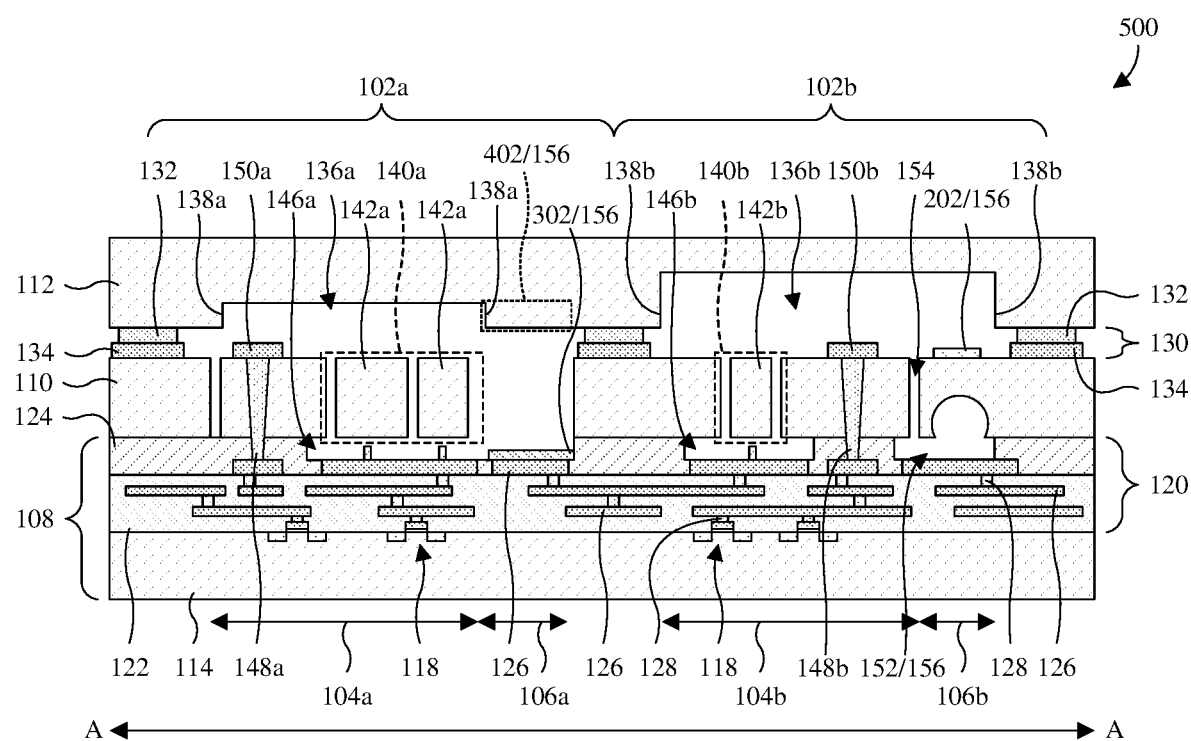
FIG. 6 illustrates a cross-sectional view of some other embodiments of the sensor of FIG. 5A.

FIG. 6 illustrates a cross-sectional view of some other embodiments of the sensor 500 of FIG. 5A.

As shown in FIG. 6, the outgassing structure 302 may be disposed on one of the plurality of conductive lines 126. Further, the first dummy area 106a does not comprise a portion of the MEMS substrate 110. It will be appreciated that, in some embodiments, the first dummy area 106a may comprise a movable portion of the MEMS substrate 110. In further embodiments, a portion of the MEMS substrate 110 and a portion of the passivation layer 124 directly over the outgassing structure 302 may be removed, such that an upper surface of the outgassing structure 302 and a sidewall of the outgassing structure 302 define sidewalls of the first cavity 136a. In yet further embodiments, because the upper surface of the outgassing structure 302 and the sidewall of the outgassing structure 302 define sidewalls of the first cavity 136a, the outgassing structure 302 may more efficiently increase the pressure inside the first cavity 136a.

In some embodiments, only free space may be disposed directly between the upper surface of the outgassing structure 302 and a bottom surface of the third portion 402 of the cap substrate 112. In other embodiments, a portion of the MEMS substrate 110 may be disposed directly between the upper surface of the outgassing structure 302 and the bottom surface of the third portion 402 of the cap substrate 112. In such embodiments, the portion of the MEMS substrate 110 disposed directly between the upper surface of the outgassing structure 302 and the bottom surface of the third portion 402 of the cap substrate 112 may be a movable portion of the MEMS substrate 110.

Figure 7:
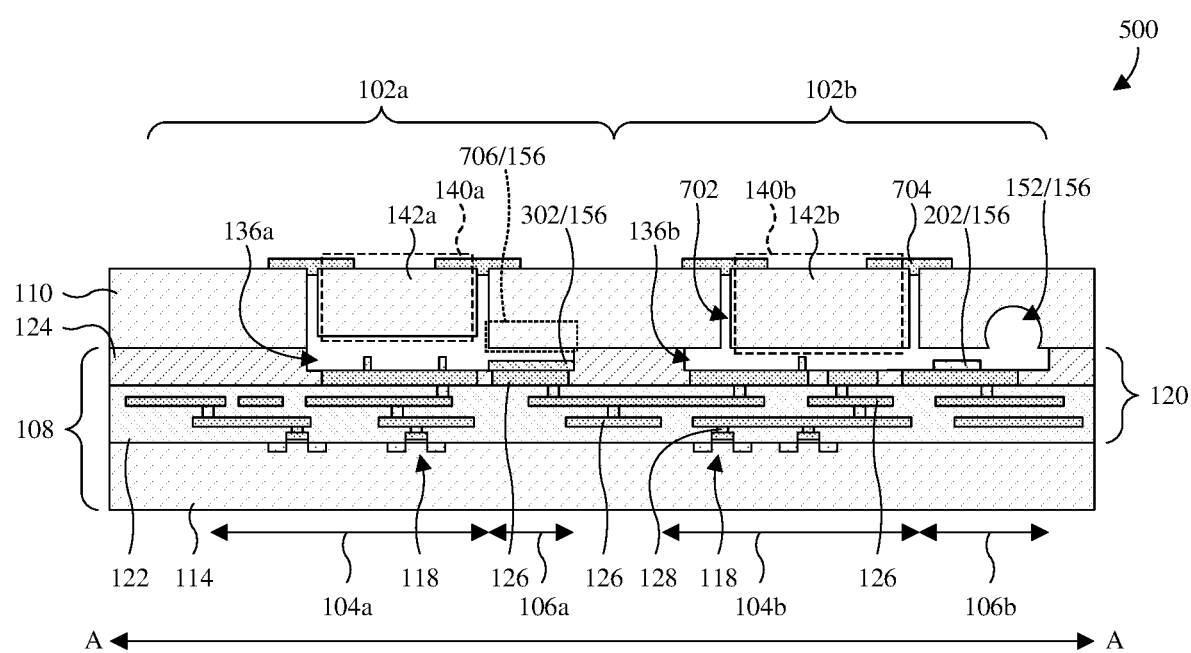
FIG. 7 illustrates a cross-sectional view of some other embodiments of the sensor of FIG. 5A.

FIG. 7 illustrates a cross-sectional view of some other embodiments of the sensor 500 of FIG. 5A.

As shown in FIG. 7, one or more vent holes 702 are disposed in the MEMS substrate 110. The one or more plugs 704 are disposed on the MEMS substrate 110 and over the one or more vent holes 702, respectively. The one or more plugs 704 are configured to seal a corresponding cavity 136. For example, some of the one or more plugs 704 may be disposed over some of the one or more vent holes 702, respectively, and are configured to seal the first cavity 136a, while some other of the one or more plugs 704 may be disposed over some other of the one or more vent holes 702, respectively, and are configured to seal the second cavity 136b. In such embodiments, the sensor 500 may comprise only two semiconductor substrates (e.g., the MEMS substrate 110 and the chip substrate 114). In some embodiments, the one or more plugs 704 may comprise, for example, aluminum, titanium, an oxide (e.g., $SiO_2$), a nitride (e.g., SiN), an oxy-nitride (e.g., $SiO_xN_y$), amorphous silicon, germanium, or the like.

In some embodiments, one of the pressure enhancement structures 156 is a fourth portion 706 of the MEMS substrate 110. The fourth portion 706 of the MEMS substrate 110 is configured to increase an amount the pressure inside the first cavity 136a increases after the first cavity 136a has been sealed. In some embodiments, the first cavity 136a may be sealed by forming some of the one or more plugs 704 (e.g., via CVD, PVD, etc.) on the MEMS substrate 110 while the sensor 500 is in a vacuum chamber having a sealing pressure. In further embodiments, the fourth portion 706 of the MEMS substrate 110 may increase the amount the pressure inside the first cavity 136a increases by decreasing the volume of the first cavity 136a, such that, as gases outgas from the sensor 500, the outgassing gases increase the pressure in the first cavity 136a more with the fourth portion 706 of the MEMS substrate 110 than without the fourth portion 706 of the MEMS substrate 110.

In some embodiments, the fourth portion 706 of the MEMS substrate 110 is partially defined by an area of the MEMS substrate 110 that extends laterally from a sidewall of the first cavity 136a and through the first dummy area 106a. In such embodiments, the fourth portion 706 of the MEMS substrate 110 is further defined by an area of the MEMS substrate 110 that extends a distance vertically from a lower surface of the first movable element 142a, wherein the distance is a shortest distance from a lower surface of the first movable element 142a to a lower surface of the MEMS substrate 110. In further embodiments, a width of the fourth portion 706 of the MEMS substrate 110 may be between about 1 um and about 2,000 um. In yet further embodiments, the getter structure 202 is disposed between the MEMS substrate 110 and the chip substrate 114.

FIGS. 8-18 illustrate a series of cross-sectional views of some embodiments of a method for forming the sensor 500 of FIGS. 5A-5B.

Figure 8:
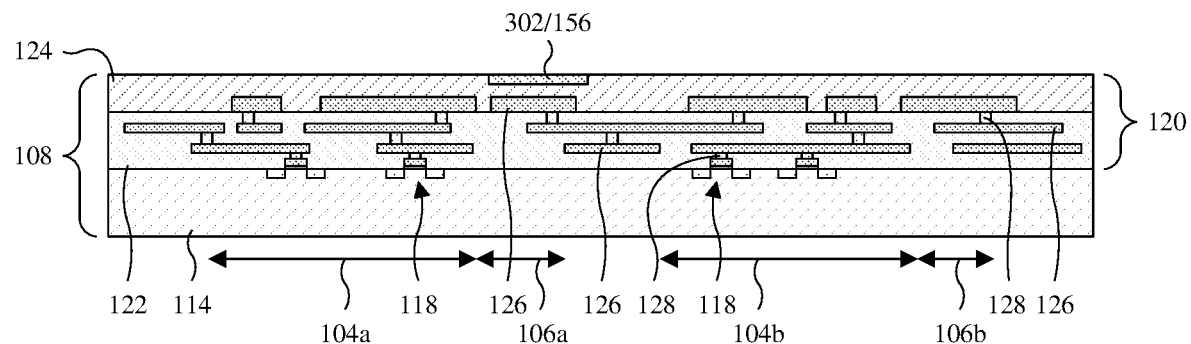
FIGS. 8-18 illustrate a series of cross-sectional views of some embodiments of a method for forming the sensor of FIGS. 5A-5B.

As shown in FIG. 8, an outgassing structure 302 (also referred to as a pressure enhancement structure 156) is formed in an integrated chip (IC) 108. The outgassing structure 302 is formed in a first dummy area 106a. In some embodiments, the outgassing structure 302 is formed in a passivation layer 124 of the IC 108. In further embodiments, the outgassing structure 302 is formed with an upper surface that is co-planar with an upper surface of the passivation layer 124.

In some embodiments, a process for forming the outgassing structure 302 comprises forming a masking layer (not shown) (e.g., negative/positive photoresist) on the passivation layer 124. Thereafter, the passivation layer 124 is exposed to an etchant (e.g., a wet/dry etchant). The etchant removes unmasked portion(s) of the passivation layer 124, thereby forming an opening in the passivation layer 124. Subsequently, in some embodiments, the masking layer is stripped away.

Further, after the opening is formed in the passivation layer 124, an outgassing layer (not shown) is deposited on the passivation layer 124 and in the opening. Thereafter, a planarization process (e.g., chemical-mechanical polishing (CMP)) may be performed into the outgassing layer and/or the masking layer to remove an upper portion of the outgassing layer, thereby forming the outgassing structure 302. In further embodiments, the planarization process is performed into the passivation layer 124 to planarize the upper surface of the passivation layer 124 and the upper surface of the outgassing structure 302.

In some embodiments, the outgassing layer may be deposited by, for example, chemical vapor deposition (CVD), physical vapor deposition (PVD), atomic layer deposition (ALD), sputtering, thermal oxidation, epitaxy, some other deposition or growth process, or a combination of the foregoing. In further embodiments, the outgassing layer comprises, for example, an oxide (e.g., $SiO_2$), a nitride (e.g. SiN), an oxy-nitride (e.g., $SiO_xN_y$), some other outgassing material, or a combination of the foregoing. In yet further embodiments, the outgassing layer may comprise a different material than the passivation layer 124.

Figure 9:
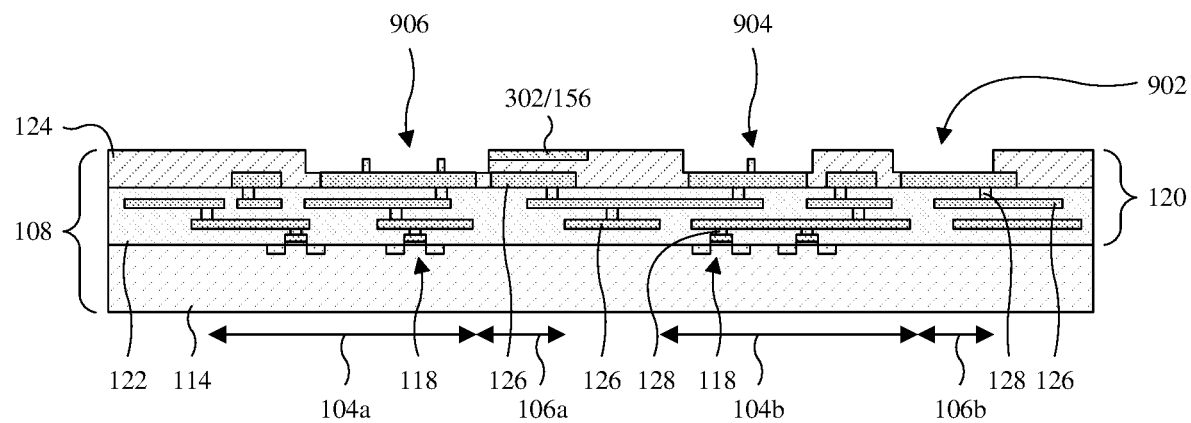

As shown in FIG. 9, a first opening 902, a second opening 904, and a third opening 906 are formed in the passivation layer 124. The first opening 902 is formed in a second dummy area 106b. In some embodiments, a process for forming the first opening 902, the second opening 904, and the third opening 906 comprises forming a masking layer (not shown) (e.g., negative/positive photoresist) on the passivation layer 124 and the outgassing structure 302. Thereafter, the passivation layer 124 is exposed to an etchant (e.g., wet/dry etchant). The etchant removes unmasked portion(s) of the passivation layer 124, thereby forming the first opening 902, the second opening 904, and the third opening 906. Subsequently, in some embodiments, the masking layer is stripped away.

In some embodiments, the third opening 906 may extend laterally into the first dummy area 106a, such that one of the plurality of conductive lines 126 is exposed in the first dummy area 106a. In such embodiments, the outgassing structure 302 may be formed on the one of the plurality of conductive lines 126 after the first opening 902, the second opening 904, and the third opening 906 have been formed. In further such embodiments, the outgassing structure 302 may be formed with an upper surface that is disposed below an upper surface of the passivation layer 124 (See, e.g., FIG. 6).

Figure 10:
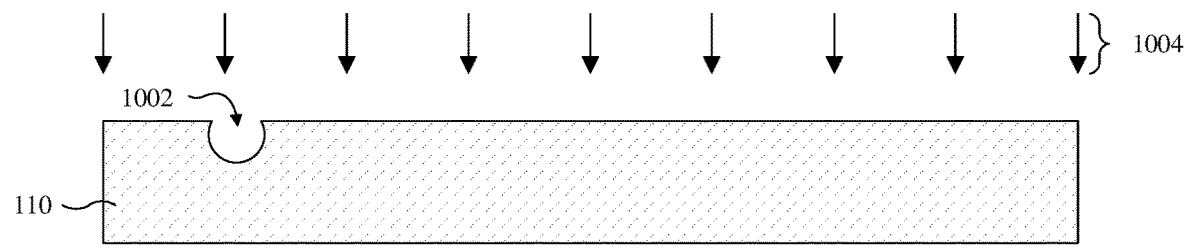

As shown in FIG. 10, a fourth opening 1002 is formed in a MEMS substrate 110. In some embodiments, the fourth opening 1002 may have a semicircular profile or some other geometric shape. In further embodiments, the fourth opening 1002 may be one of a plurality of openings formed in the MEMS substrate 110. The fourth opening 1002 may have a width between about 1 um and about 2,000 um. More specifically, the fourth opening 1002 may have a width between about 5 um and about 500 um. In further embodiments, the fourth opening 1002 may have a height between about ten percent of a height of the MEMS substrate 110 (e.g., between an upper surface and a lower surface) and about eighty percent of the height of the MEMS substrate 110.

In some embodiments, a process for forming the fourth opening 1002 comprises forming a masking layer (not shown) (e.g., negative/positive photoresist) on the MEMS substrate 110. Thereafter, an etch 1004 (e.g., wet/dry etch) is performed on the MEMS substrate 110 by exposing the MEMS substrate 110 to an etchant (e.g., a wet/dry etchant). The etchant removes unmasked portion(s) of the MEMS substrate 110, thereby forming the fourth opening 1002 in the MEMS substrate 110. Subsequently, in some embodiments, the masking layer is stripped away.

Figure 11:
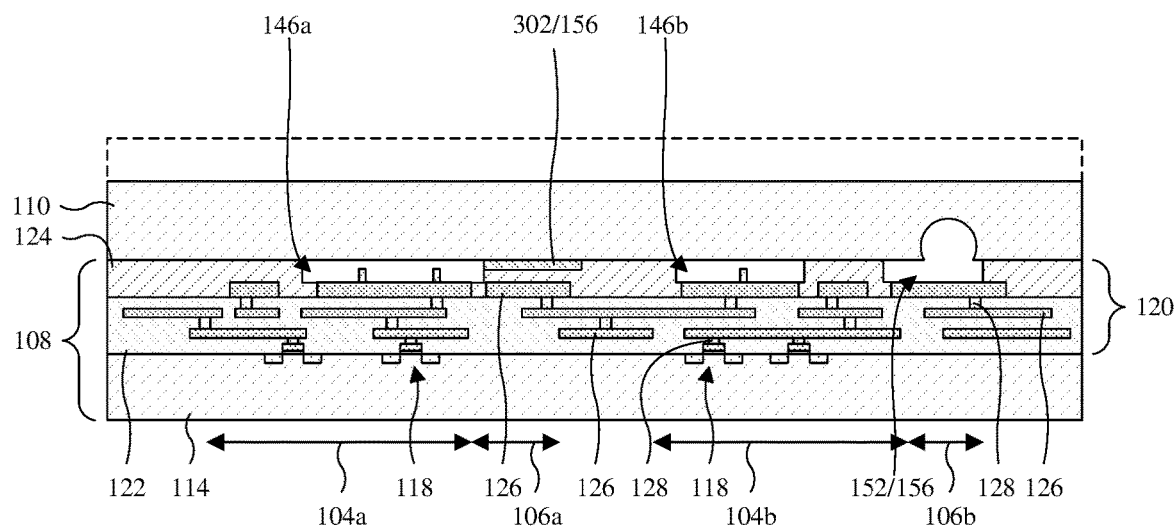

As shown in FIG. 11, the MEMS substrate 110 is bonded to the IC 108. In some embodiments, bonding the MEMS substrate 110 to the IC 108 forms a first lower portion 146a of a first cavity 136a (See infra), a second lower portion 146b of a second cavity 136b (See infra), and an embedded chamber 152 (also referred to as a pressure enhancement structure 156). The embedded chamber 152 is formed in the second dummy area 106b.

In some embodiments, a process for bonding the MEMS substrate 110 to the IC 108 comprises flipping the MEMS substrate 110 (e.g., rotating 180 degrees). The MEMS substrate 110 is aligned with the IC 108, such that the fourth opening 1002 (See, e.g., FIG. 10) is aligned directly over the first opening 902 (See, e.g., FIG. 9). Thereafter, the MEMS substrate 110 is bonded to the IC 108, thereby forming the first lower portion 146a of a first cavity 136a, the second lower portion 146b of a second cavity 136b, and the embedded chamber 152. In some embodiments, the MEMS substrate 110 may be bonded to the IC 108 by, for example, direct bonding, hybrid bonding, eutectic bonding, or some other boning process. In yet further embodiments, after the MEMS substrate 110 is bonded to the IC 108, the MEMS substrate 110 is thinned down by removing (e.g., via grinding or CMP) an upper portion of the MEMS substrate 110 (illustrated by a dotted line in FIG. 11).

Figure 12:
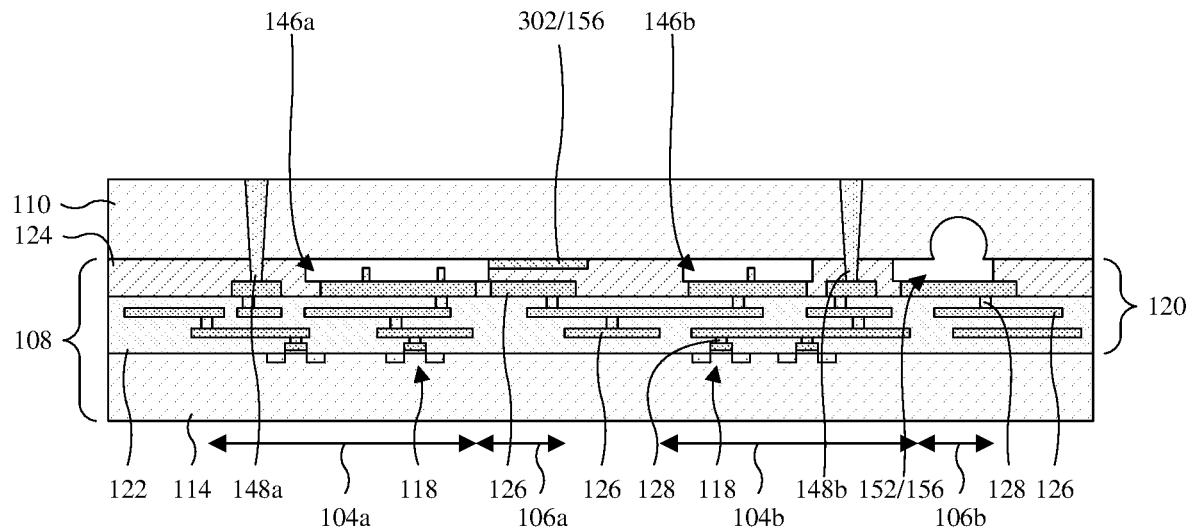

As shown in FIG. 12, a plurality of through-substrate vias (TSVs) 148a-b are formed extending through the MEMS substrate 110 to the IC 108. For example, a first TSV 148a is formed in the first sensor area 104a, and a second TSV 148b is formed in the second sensor area 104b.

In some embodiments, a process for forming the plurality of TSVs 148a-b comprises forming a masking layer (not shown) (e.g., negative/positive photoresist) on the MEMS substrate 110. Thereafter, the MEMS substrate 110 is exposed to an etchant (e.g., a wet/dry etchant). The etchant removes unmasked portion(s) of the MEMS substrate 110 and underlying portions of the passivation layer 124, thereby forming a plurality of openings (not shown) that extend through the MEMS substrate 110 to the IC 108.

Further, after the plurality of openings are formed, a conductive layer (not shown) is deposited on the MEMS substrate 110 and filling the plurality of openings. In some embodiments, the conductive layer comprises, for example, copper, aluminum copper, aluminum, some other conductive material, or a combination of the foregoing. In further embodiments, the conductive layer may be deposited by, for example, CVD, PVD, ALD, sputtering, electrochemical plating, electroless plating, some other deposition process, or a combination of the foregoing. Thereafter, a planarization process (e.g., CMP) is performed into the conductive layer to remove an upper portion of the conductive layer, thereby forming the plurality of TSVs 148a-b.

In some embodiments, the process for forming the plurality of TSVs 148a-b may comprise multiple etching processes. For example, a first etching process may be performed before the MEMS substrate 110 is bonded to the IC 108 to form first openings that extend through the passivation layer 124. Thereafter, after the MEMS substrate 110 and the IC 108 are bonded together, a second etching process may be performed to form second openings that extend through the MEMS substrate 110. The first etching process and the second etching process are aligned, such that the first openings and the second openings form a plurality of TSVs openings that extend through the MEMS substrate 110 and the passivation layer 124. Subsequently, the conductive layer (not shown) may be deposited on the MEMS substrate 110 and filling the plurality of TSVs openings. It will be appreciated that, in some embodiments, the first openings may be filled with a conductive material prior to bonding the MEMS substrate 110 to the IC 108.

Figure 13:
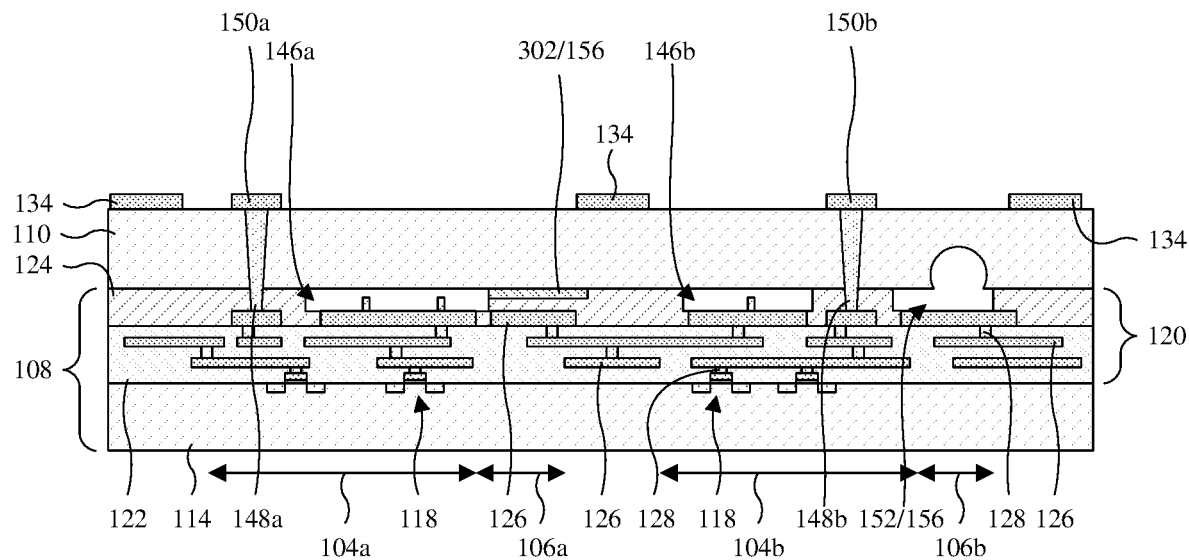

As shown in FIG. 13, a lower bond ring 134 and a plurality of TSV pads 150a-b are formed on the MEMS substrate 110. Further, the plurality of TSV pads 150a-b are formed on the plurality of TSVs 148a-b, respectively. For example, a first TSV pad 150a may be formed on the first TSV 148a, and a second TSV pad 150b may be formed on the second TSV 148b. In some embodiments, the lower bond ring 134 is formed with a ring-shaped top layout that continuously extends around the first sensor area 104a and the first dummy area 106a, between the first dummy area 106a and the second sensor area 104b, and around the second sensor area 104b and the second dummy area 106b. In some embodiments, the lower bond ring 134 and the plurality of TSV pads 150a-b comprise a same material. In other embodiments, the lower bond ring 134 and the plurality of TSV pads 150a-b comprise different materials.

In some embodiments, a process for forming the lower bond ring 134 and the plurality of TSV pads 150a-b comprises forming a masking layer (not shown) (e.g., negative/positive photoresist) on the MEMS substrate 110 and the plurality of TSVs 148a-b. The masking layer comprises a plurality of openings that expose portions of the MEMS substrate 110 and the plurality of TSVs 148a-b.

Further, a conductive layer (not shown) is then deposited on the masking layer and in the plurality of openings. In some embodiments, the conductive layer comprises, for example, aluminum, copper, gold, tin, some other conductive material, or a combination of the foregoing. In further embodiments, the conductive layer may be deposited by, for example, CVD, PVD, ALD, sputtering, electrochemical plating, electroless plating, some other deposition process, or a combination of the foregoing. Thereafter, a planarization process (e.g., CMP) is performed into the conductive layer to remove an upper portion of the conductive layer, thereby forming the lower bond ring 134 and the plurality of TSV pads 150a-b. Subsequently, in some embodiments, the masking layer is stripped away.

Figure 14:
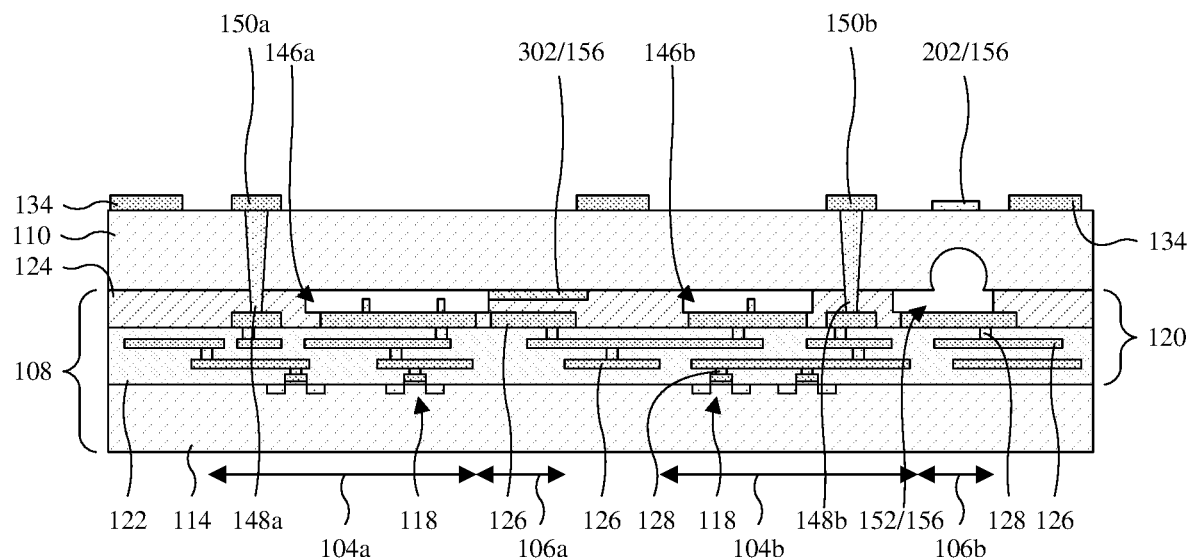

As shown in FIG. 14, a getter structure 202 (also referred to as a pressure enhancement structure 156) is formed on the MEMS substrate 110. The getter structure 202 is formed in the second dummy area 106b. In some embodiments, a process for forming the getter structure 202 comprises depositing a getter layer (not shown) on the MEMS substrate 110, the lower bond ring 134, and the plurality of TSV pads 150a-b. In some embodiments, the getter layer may comprise, for example, titanium, zirconium, titanium zirconium, magnesium, some other getter material, or a combination of the foregoing. In further embodiments, the getter layer may be deposited by, for example, CVD, PVD, ALD, sputtering, electrochemical plating, electroless plating, some other deposition process, or a combination of the foregoing.

Thereafter, a masking layer (not shown) (e.g., negative/positive photoresist) is formed on the getter layer. The getter layer is then exposed to an etchant (e.g., a wet/dry etchant). The etchant removes unmasked portion(s) of the getter layer, thereby forming the getter structure 202. Subsequently, in some embodiments, the masking layer is stripped away.

Figure 15:
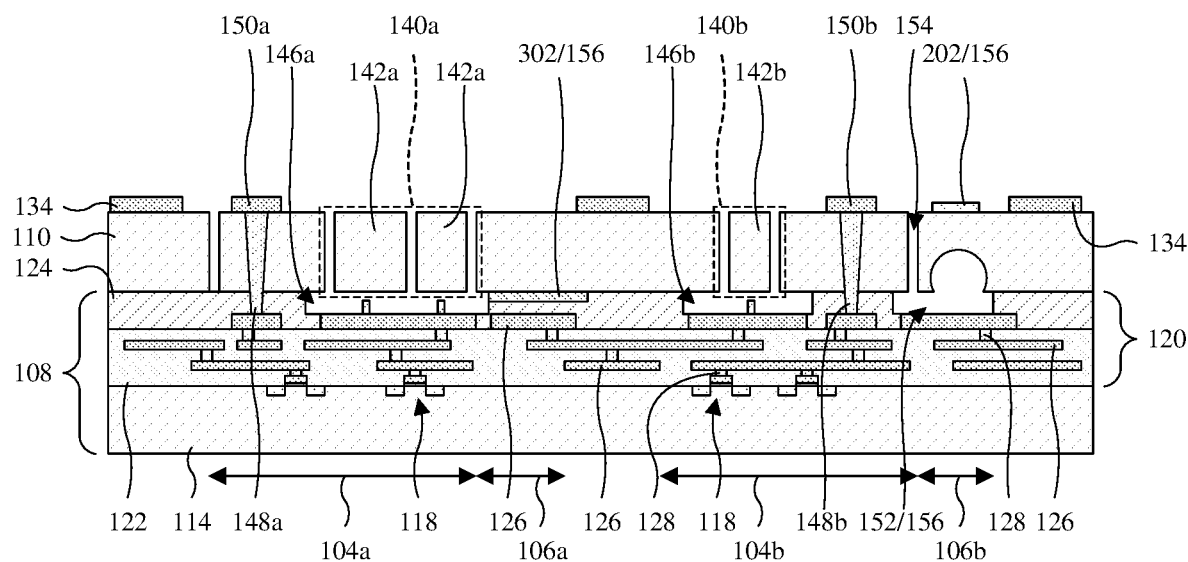

As shown in FIG. 15, a plurality of moveable elements 142a-b are formed in the MEMS substrate 110. For example, first movable elements 142a are formed in the first sensor area 104a, and a second movable element 142b is formed in the second sensor area 104b. Further, a channel 154 is formed in the MEMS substrate 110 and in the second sensor area 104b. The channel 154 is formed extending through the MEMS substrate 110 to the embedded chamber 152. In some embodiments, forming the first movable elements 142a forms a first movable portion 140a of the MEMS substrate 110, and forming the second movable element forms a second movable portion 140b of the MEMS substrate.

In some embodiments, a process for forming the plurality of moveable elements 142a-b and the channel 154 comprises forming a masking layer (not shown) (e.g., negative/positive photoresist) on the MEMS substrate 110, the lower bond ring 134, the plurality of TSV pads 150a-b, and the getter structure 202. Thereafter, the MEMS substrate 110 is exposed to an etchant (e.g., a wet/dry etchant). The etchant removes unmasked portion(s) of the MEMS substrate 110, thereby forming the plurality of moveable elements 142a-b and the channel 154. Subsequently, in some embodiments, the masking layer is stripped away. In further embodiments, the process for forming the plurality of moveable elements 142a-b and the channel 154 may also remove a portion of the MEMS substrate 110 in the first dummy area 106a (See, e.g., FIG. 6).

Figure 16:
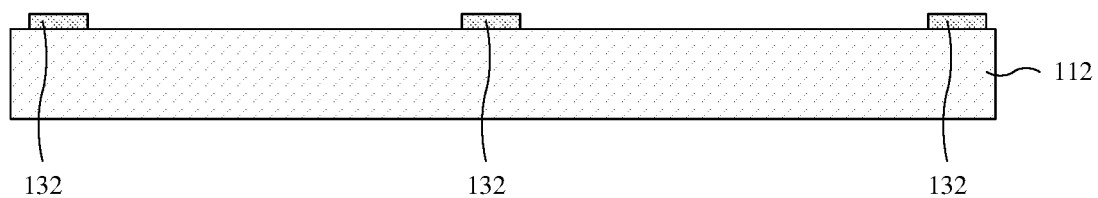

As shown in FIG. 16, an upper bond ring 132 is formed on a cap substrate 112. In some embodiments, the upper bond ring 132 is formed with a layout that corresponds to the layout of the lower bond ring 134.

In some embodiments, a process for forming the upper bond ring 132 comprises forming a masking layer (not shown) (e.g., negative/positive photoresist) on the cap substrate 112. The masking layer comprises a plurality of openings that expose portions of the cap substrate 112. Further, a bonding layer is then deposited on the masking layer and filling the plurality of openings. In some embodiments, the bonding layer comprises, for example, aluminum, copper, gold, tin, some other bonding material, or a combination of the foregoing. In further embodiments, the bonding layer may be deposited by, for example, CVD, PVD, ALD, sputtering, electrochemical plating, electroless plating, some other deposition process, or a combination of the foregoing. Thereafter, a planarization process (e.g., CMP) is performed into the bonding layer to remove an upper portion of the bonding layer, thereby forming the upper bond ring 132. Subsequently, in some embodiments, the masking layer is stripped away.

Figure 17:
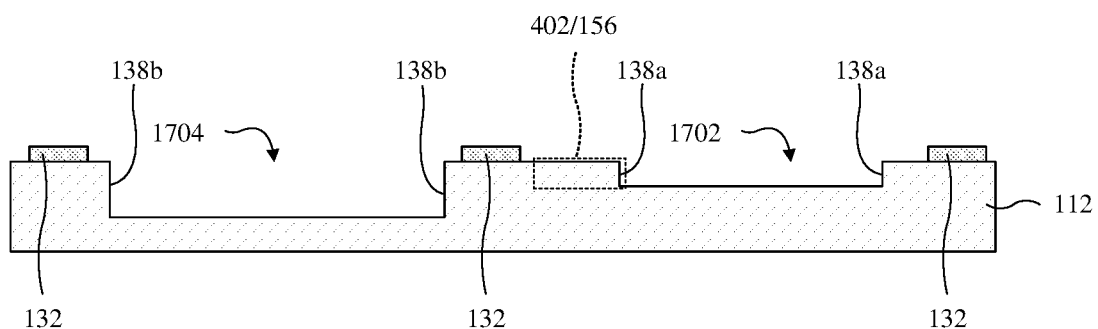

As shown in FIG. 17, a fifth opening 1702 and a sixth opening 1704 are formed in the cap substrate 112. In some embodiments, a first pair of sidewalls 138a of the cap substrate 112 define sidewalls of the fifth opening 1702, and a second pair of sidewalls 138b of the cap substrate 112 define sidewalls of the sixth opening 1704. In further embodiments, the fifth opening 1702 is formed on an opposite side of a portion of the upper bond ring 132 as the sixth opening 1704. The sixth opening 1704 may be formed as a larger opening than the fifth opening 1702. In further embodiments, the fifth opening 1702 may be formed with a different height than the sixth opening 1704. In yet further embodiments, forming the fifth opening 1702 and the sixth opening 1704 selectively leaves a third portion 402 of the cap substrate 112 (also referred to as a pressure enhancement structure 156) in place.

In some embodiments, a process for forming the fifth opening 1702 and the sixth opening 1704 comprises depositing a first masking layer (not shown) (e.g., negative/positive photoresist) on the cap substrate 112 and the upper bond ring 132. The cap substrate 112 is then exposed to a first etchant (e.g., a wet/dry etchant). The first etchant removes a first unmasked portion of the cap substrate 112, thereby forming the fifth opening 1702. In further embodiments, a second masking layer (not shown) (e.g., e.g., negative/positive photoresist) is then deposited on the first masking layer and in the fifth opening 1702. The cap substrate 112 is then exposed to a second etchant (e.g., a wet/dry etchant). The second etchant removes a second unmasked portion of the cap substrate 112, thereby forming the sixth opening 1704.

Figure 18:
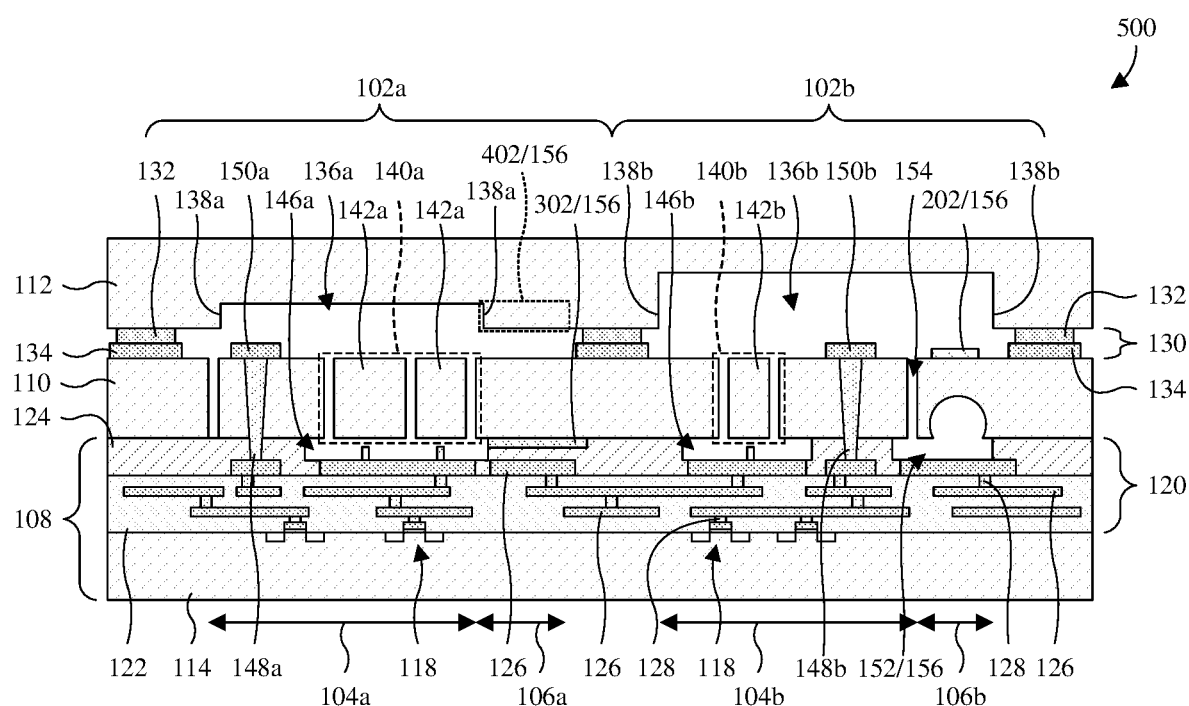

As shown in FIG. 18, the cap substrate 112 is bonded to the MEMS substrate 110, thereby forming a first cavity 136*a* and a second cavity 136*b*. In some embodiment, the first cavity 136*a* and the second cavity 136*b* are formed as sealed cavities. In further embodiments, the first cavity 136*a* and the second cavity 136*b* are sealed at a same sealing pressure.

In some embodiments, a process for bonding the cap substrate 112 to the MEMS substrate 110 comprises bonding the upper bond ring 132 to the lower bond ring 134. The upper bond ring 132 may be bonded to the lower bond ring 134 at the sealing pressure by, for example, eutectic bonding. It will be appreciated that the cap substrate 112 may be bonded to the MEMS substrate 110 via other bonding processes (e.g., direct bonding, hybrid bonding, etc.). In further embodiments, after the cap substrate 112 is bonded to the MEMS substrate 110, formation of the first MEMS device 102*a* and the second MEMS device 102*b* is complete.

In some embodiments, the first MEMS device 102*a* is configured to operate at a first operating pressure, and the second MEMS device 102*b* is configured to operate at a second operating pressure different than the first operating pressure. In further embodiments, the first and/or second operating pressure may be different than the sealing pressure. Because various pressure enhancement structures may be formed in the first dummy area 106*a* and/or the second dummy area 106*b*, a pressure inside the first cavity 136*a* and/or the second cavity 136*b* may be selectively tuned without having to open and reseal the first cavity 136*a* and/or the second cavity 136*b* at a different pressure. Accordingly, a cost to manufacture the sensor 500 may be reduced.

For example, the first cavity 136*a* and the second cavity 136*b* may be sealed at a same sealing pressure (e.g., less than about 5 mTorr). After the first cavity 136*a* is sealed, the outgassing structure 302 may increase the pressure inside the first cavity 136*a* from the sealing pressure to the first operating pressure by outgassing gases. Further, the third portion 402 of the cap substrate 112 may increase the pressure inside the first cavity 136*a* by reducing the volume of the first cavity 136*a*. Without breaking the seal of the second cavity 136*b*, the getter structure 202 may reduce the pressure inside the second cavity 136*b* from the sealing pressure to the second operating pressure by absorbing outgassed gases in the second cavity 136*b*. In addition, the embedded chamber 152 may reduce the pressure inside the second cavity 136*b* by increasing a volume of the second cavity 136*b*.

Figure 19:
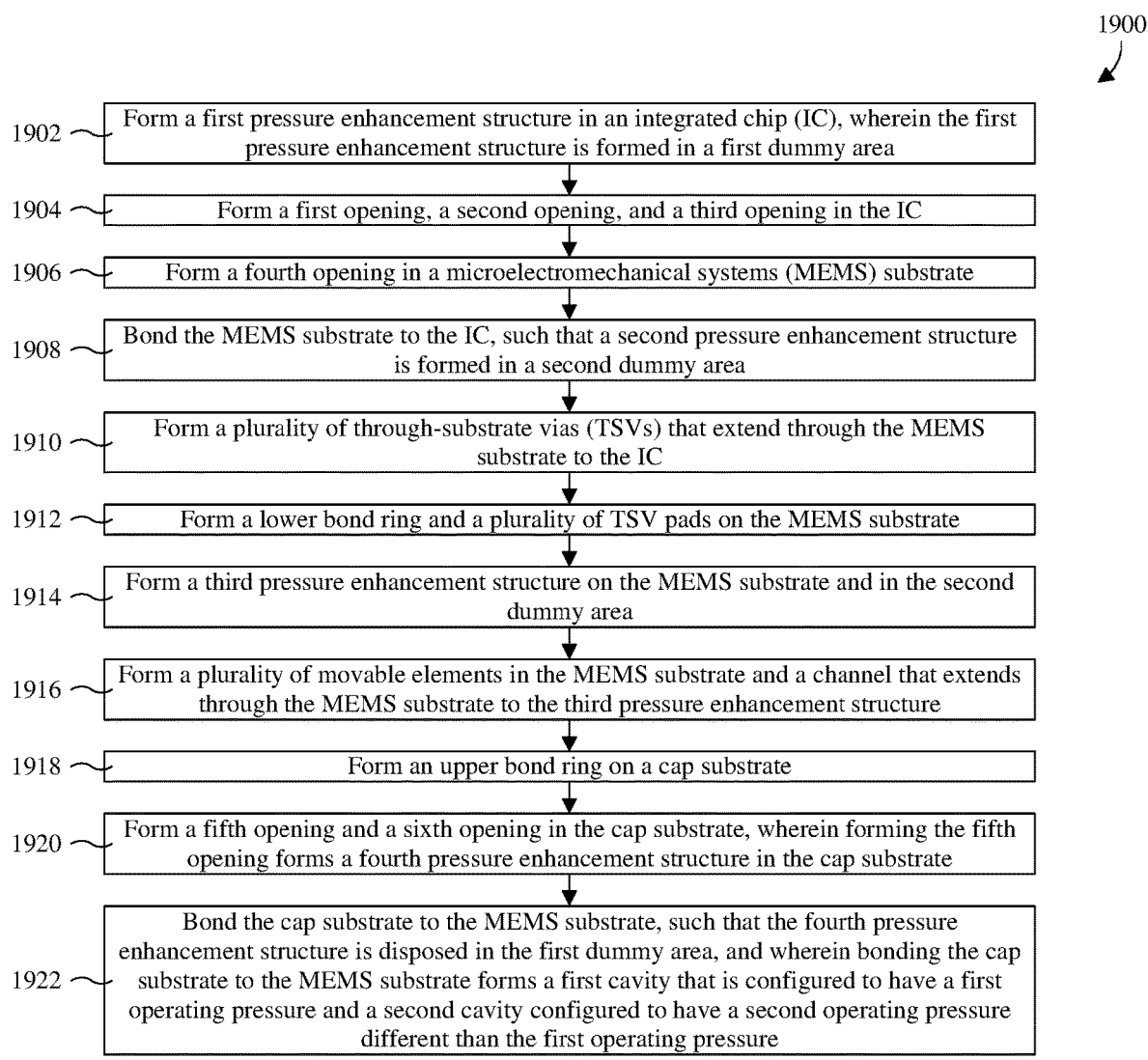
FIG. 19 illustrates a flowchart of some embodiments of a method for forming a sensor comprising a plurality of MEMS devices each having dummy-area utilization for pressure enhancement.

As illustrated in FIG. 19, a flowchart 1900 of some embodiments of a method for forming a sensor comprising a plurality of MEMS devices each having dummy-area utilization for pressure enhancement. While the flowchart 1900 of FIG. 19 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At 1902, a first pressure enhancement structure is formed in an integrated chip (IC), wherein the first pressure enhancement structure is formed in a first dummy area. FIG. 8 illustrates a cross-sectional view of some embodiments corresponding to act 1902.

At 1904, a first opening, a second opening, and a third opening are formed in the IC. FIG. 9 illustrates a cross-sectional view of some embodiments corresponding to act 1904.

At 1906, a fourth opening is formed in a microelectromechanical systems (MEMS) substrate. FIG. 10 illustrates a cross-sectional view of some embodiments corresponding to act 1906.

At 1908, the MEMS substrate is bonded to the IC, such that a second pressure enhancement structure is formed in a second dummy area. FIG. 11 illustrates a cross-sectional view of some embodiments corresponding to act 1908.

At 1910, a plurality of through-substrate vias (TSVs) that extend through the MEMS substrate to the IC are formed. FIG. 12 illustrates a cross-sectional view of some embodiments corresponding to act 1910.

At 1912, a lower bond ring and a plurality of TSV pads are formed on the MEMS substrate. FIG. 13 illustrates a cross-sectional view of some embodiments corresponding to act 1912.

At 1914, a third pressure enhancement structure is formed on the MEMS substrate and in the second dummy area. FIG. 14 illustrates a cross-sectional view of some embodiments corresponding to act 1914.

At 1916, a plurality of movable elements are formed in the MEMS substrate, and a channel is formed that extends through the MEMS substrate to the third pressure enhancement structure. FIG. 15 illustrates a cross-sectional view of some embodiments corresponding to act 1916.

At 1918, an upper bond ring is formed on a cap substrate. FIG. 16 illustrates a cross-sectional view of some embodiments corresponding to act 1918.

At 1920, a fifth opening and a sixth opening are formed in the cap substrate, wherein forming the fifth opening forms a fourth pressure enhancement structure in the cap substrate. FIG. 17 illustrates a cross-sectional view of some embodiments corresponding to act 1920.

At 1922, the cap substrate is bonded to the MEMS substrate, such that the fourth pressure enhancement structure is disposed in the first dummy area, and wherein bonding the cap substrate to the MEMS substrate forms a first cavity that is configured to have a first operating pressure and a second cavity configured to have a second operating pressure different than the first operating pressure. FIG. 18 illustrates a cross-sectional view of some embodiments corresponding to act 1922.

In some embodiments, the present application provides a sensor. The sensor comprises a microelectromechanical systems (MEMS) substrate disposed over an integrated chip (IC). The IC defines a lower portion of a first cavity and a lower portion of a second cavity, wherein the first cavity has a first operating pressure that is different than an operating pressure of the second cavity. A cap substrate is disposed over the MEMS substrate, wherein a first pair of sidewalls of the cap substrate partially define an upper portion of the first cavity, and a second pair of sidewalls of the cap substrate partially define an upper portion of the second cavity. A sensor area and a dummy area are disposed in the first cavity. The sensor area comprises a movable portion of the MEMS substrate, and the dummy area comprises a fixed portion of the MEMS substrate. A pressure enhancement structure is disposed in the dummy area.

In other embodiments, the present application provides a sensor. The sensor comprises an integrated chip (IC) that defines a lower portion of a first sealed cavity and a lower portion of a second sealed cavity. A microelectromechanical systems (MEMS) substrate is disposed over the IC. The MEMS substrate has a first movable portion and a first fixed portion that are both disposed in the first sealed cavity, and a second movable portion and a second fixed portion that are both disposed in the second sealed cavity. A cap substrate is disposed over the MEMS substrate, wherein the cap substrate partially defines an upper portion of the first sealed cavity and an upper portion of the second sealed cavity. A bond structure is disposed between the MEMS substrate and the cap substrate, wherein a portion of the bond structure separates the first sealed cavity from the second sealed cavity. A first pressure enhancement structure disposed in the first fixed portion, wherein the first pressure enhancement structure is configured to change a pressure of the first sealed cavity from a sealing pressure, which corresponds to a pressure at which the first sealed cavity and the second sealed cavity are sealed, to a first operating pressure that is different than the sealing pressure.

In yet other embodiments, the present application provides a method for forming a sensor. The method comprises forming an integrated chip having an interconnect structure disposed on a chip substrate, wherein the interconnect structure comprises a passivation layer. A first opening and a second opening are formed in the passivation layer, wherein the first opening is spaced from the second opening. A third opening is formed in a microelectromechanical systems (MEMS) substrate. The MEMS substrate is bonded to the passivation layer, such that the third opening directly overlies and opens to the second opening, thereby forming a pressure enhancement structure defined by the third opening and the second opening, and a lower portion of a cavity defined by the first opening. After the MEMS substrate is bonded to the passivation layer, a movable element that directly overlies the lower portion of the cavity is formed in the MEMS substrate, and a channel that extends through an upper surface of the MEMS substrate to the pressure enhancement structure is formed. A fourth opening is formed in a cap substrate. The cap substrate is bonded to the MEMS substrate to seal both the cavity and the pressure enhancement structure, wherein sidewalls of the fourth opening partially define an upper portion of the cavity, and wherein the upper portion of the cavity is in fluid communication with both the pressure enhancement structure and the lower portion of the cavity.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A sensor comprising:
a microelectromechanical systems (MEMS) substrate disposed over an integrated chip (IC), wherein the IC at least partially defines a first cavity and at least partially defines a second cavity, and wherein the first cavity has a first operating pressure and the second cavity has a second operating pressure that is different than the first operating pressure;
a sensor area and a dummy area disposed in the first cavity, wherein the sensor area comprises a movable portion of the MEMS substrate, and wherein the dummy area comprises a fixed portion of the MEMS substrate; and
a pressure enhancement structure disposed in the dummy area.

2. The sensor of claim 1, wherein:
the pressure enhancement structure is a getter structure configured to decrease a pressure of the first cavity from a sealing pressure to the first operating pressure; and
the sealing pressure corresponds to a pressure at which the first cavity is sealed.

3. The sensor of claim 2, wherein both the first cavity and the second cavity are sealed at the sealing pressure.

4. The sensor of claim 1, wherein:
the pressure enhancement structure is an outgassing structure configured to increase a pressure of the first cavity from a sealing pressure to the first operating pressure; and
the sealing pressure corresponds to a pressure at which the first cavity is sealed.

5. The sensor of claim 4, wherein both the first cavity and the second cavity are sealed at the sealing pressure.

6. The sensor of claim 5, wherein:
the IC comprises a dielectric layer disposed over a chip substrate; and
the outgassing structure contacts both the dielectric layer and a lower surface of the fixed portion of the MEMS substrate.

7. The sensor of claim 6, wherein the outgassing structure partially defines a sidewall of the first cavity.

8. The sensor of claim 1, wherein:
the pressure enhancement structure is an embedded chamber that is in fluid communication with the first cavity; and
the embedded chamber is at least partially defined by the MEMS substrate.

9. The sensor of claim 8, wherein:
a sum of a volume of the first cavity and a volume of the embedded chamber is different than a volume of the second cavity.

10. The sensor of claim 9, wherein the volume of the first cavity and the volume of the second cavity are substantially the same.

11. The sensor of claim 8, wherein a sum of a volume of the first cavity and a volume of the embedded chamber is substantially the same as a volume of the second cavity.

12. The sensor of claim 8, wherein:
the IC comprises a chip substrate;
a dielectric layer is disposed vertically between the MEMS substrate and the chip substrate; and
the embedded chamber is partially defined by the MEMS substrate and is partially defined by a dielectric layer.

13. A sensor comprising:
a dielectric layer disposed over a first substrate, wherein the dielectric layer at least partially defines a first cavity and a second cavity;
a second substrate disposed over the dielectric layer, wherein the second substrate has a first movable portion and a first fixed portion that are both disposed in the first cavity, and wherein the second substrate has a second movable portion and a second fixed portion that are both disposed in the second cavity; and a first pressure enhancement structure disposed in the first fixed portion.

14. The sensor of claim 13, wherein the first cavity has a first operating pressure and the second cavity has a second operating pressure that is different than the first operating pressure.

15. The sensor of claim 13, wherein the dielectric layer is bonded to the second substrate.

16. The sensor of claim 13, wherein the first pressure enhancement structure is configured to change a pressure of the first cavity from a sealing pressure to a first operating pressure that is different than the sealing pressure.

17. The sensor of claim 13, further comprising:
a third substrate disposed over both the first substrate and the second substrate, wherein:
first sidewalls of the third substrate partially define an upper portion of the first cavity;
second sidewalls of the third substrate partially define an upper portion of the second cavity;
first sidewalls of the dielectric layer partially define a lower portion of the first cavity;
second sidewalls of the dielectric layer partially define a lower portion of the second cavity;
the upper portion of the first cavity is in fluid communication with the lower portion of the first cavity; and
the upper portion of the second cavity is in fluid communication with the lower portion of the second cavity.

18. The sensor of claim 13, further comprising:
a second pressure enhancement structure disposed in the second fixed portion.

19. A sensor comprising:
one or more semiconductor devices disposed on a chip substrate;
a dielectric structure disposed over the chip substrate and the one or more semiconductor devices, wherein the dielectric structure at least partially defines a first cavity and a second cavity;
a metallization structure disposed in the dielectric structure and electrically coupled to the one or more semiconductor devices;
a microelectromechanical systems (MEMS) substrate disposed over the dielectric structure and the chip substrate;
a first sensor area and a dummy area disposed in the first cavity, wherein the first sensor area comprises a first movable portion of the MEMS substrate, and wherein the dummy area comprises a fixed portion of the MEMS substrate;
a second sensor area disposed in the second cavity, wherein the second sensor area comprises a second movable portion of the MEMS substrate; and
a pressure enhancement structure disposed in the dummy area.

20. The sensor of claim 19, wherein the first cavity has a first operating pressure and the second cavity has a second operating pressure that is different than the first operating pressure.

* * * * *